(12) United States Patent
Yuan et al.

(10) Patent No.: US 9,072,160 B2
(45) Date of Patent: Jun. 30, 2015

(54) ELECTRONIC DEVICE AND DOCK

(71) Applicant: Lenovo (Beijing) Limited, Beijing (CN)

(72) Inventors: Chunfeng Yuan, Beijing (CN);
Xiaosong Xia, Beijing (CN); Zhifeng Xin, Beijing (CN)

(73) Assignee: Lenovo (Beijing) Limited (CN)

( * ) Notice: Subject to any disclaimer, the term of this patent is extended or adjusted under 35 U.S.C. 154(b) by 123 days.

(21) Appl. No.: 13/908,317

(22) Filed: Jun. 3, 2013

(65) Prior Publication Data
US 2013/0321994 A1 Dec. 5, 2013

(30) Foreign Application Priority Data

Jun. 4, 2012 (CN) .......................... 2012 1 0182336

(51) Int. Cl.
*G06F 1/16* (2006.01)
*H05K 7/00* (2006.01)
*H05K 5/02* (2006.01)

(52) U.S. Cl.
CPC ................ *H05K 7/00* (2013.01); *H05K 5/0221* (2013.01); *G06F 1/1616* (2013.01); *G06F 1/1632* (2013.01); *G06F 1/1654* (2013.01); *G06F 1/1681* (2013.01)

(58) Field of Classification Search
USPC .............. 16/49, 228, 326, 334, 429; 439/681, 439/259, 377, 315, 680, 378, 188, 157, 329, 439/346, 296; 361/679.43, 679.44, 679.01, 361/679.41, 679.09, 679.56, 679.27, 361/679.37, 679.59, 679.26, 679.55, 361/679.08, 679.07, 679.21, 679.58, 361/679.33, 679.03, 679.48, 679.47; 248/551, 553, 122.1, 274.1, 309.3, 248/310, 127, 346.11, 311.2, 278.1, 281.11, 248/917, 923; 455/575.1, 575.9, 414.1, 455/403, 575.3, 566, 575.4; 312/223.1, 312/223.2, 333, 326, 405, 107, 319.1
See application file for complete search history.

(56) References Cited

U.S. PATENT DOCUMENTS

| 6,302,745 B1 * | 10/2001 | Landis et al. ................. 439/681 |
| 6,976,799 B2 | 12/2005 | Kim et al. |
| 7,599,178 B2 | 10/2009 | Huang et al. |
| 7,652,873 B2 | 1/2010 | Lee |
| 8,364,215 B2 * | 1/2013 | Jung et al. .................. 455/575.4 |
| 2011/0117978 A1 * | 5/2011 | Janik et al. ................. 455/575.9 |

FOREIGN PATENT DOCUMENTS

DE          10049218 A1     5/2002

* cited by examiner

*Primary Examiner* — Hung Duong
(74) *Attorney, Agent, or Firm* — Schwegman Lundberg & Woessner, P.A.

(57) ABSTRACT

The present disclosure provides an electronic device and a dock. The electronic device includes a first body, an insertion connector for connecting the first body, a second body connected to the insertion connector and physically connected/disconnected to/from the first body via the insertion connector by inserting the first body into the insertion connector or pulling the first body out of the insertion connector, a lock means having a locked state and an unlocked state, wherein the first body is securely connected to the insertion connector and cannot be physically pulled out of and disconnected from the insertion connector when the lock means is in the locked state and the first body is insecurely connected to the insertion connecter and can be physically pulled out of and disconnected from the insertion connecter when the lock means is in the unlocked state, and a rotation means physically connected to the lock means.

11 Claims, 3 Drawing Sheets

ELECTRONIC DEVICE AND DOCK

CROSS REFERENCE TO RELATED APPLICATIONS

This application claims the benefit and priority of a foreign application filed in China as Application No. 201210182336.5, filed on Jun. 4, 2012; the entire contents of which are incorporated herein by reference in their entirety.

TECHNICAL FIELD

The present invention relates to electronic technology, and more particularly, to an electronic device and a dock.

BACKGROUND

With breakthroughs in electronic technology, tablet computers become widespread in the market due to their convenience, portability and other characteristics. More and more users prefer to use tablet computers. Also, a mode in which a tablet computer is used in connection with a base can provide a user with an experience of using a notebook computer. However, in the prior art, the tablet computer and the base are typically connected with each other via the mechanism as shown in FIG. 1. As shown in FIG. 1, the tablet computer is connected to the base via a signal connector having secure points on both sides for securing the tablet computer. The secure points can be disconnected from the tablet computer by switching a button of the signal connector followed by a series of conversions. Then, the tablet computer can be detached from the signal connector by applying an external force, such that the tablet computer is separated from the base.

During implementation of the present application, the inventors found at least a problem in the prior art where the tablet computer can only be detached from the base by manually pressing the button, i.e., it cannot be automatically detached from the base.

SUMMARY

An electronic device and a dock is provided to solve the above problem in the prior art that the tablet computer can only be detached from the base by manually pressing the button, i.e., it cannot be automatically detached from the base.

In an aspect, according to an embodiment of the present invention, an electronic device is provided. The electronic device includes a first body, an insertion connector for connecting the first body, a second body connected to the insertion connector and physically connected/disconnected to/from the first body via the insertion connector by inserting the first body into the insertion connector or pulling the first body out of the insertion connector, a lock means having a locked state and an unlocked state, wherein the first body is securely connected to the insertion connector and cannot be physically pulled out of and disconnected from the insertion connector when the lock means is in the locked state and the first body is insecurely connected to the insertion connecter and can be physically pulled out of and disconnected from the insertion connector when the lock means is in the unlocked state, and a rotation means physically connected to the lock means. When the first body is connected to the second body via the insertion connector, the lock means is in the locked state in a case where the first body is rotated to a first rotation range with respect to the second body via the rotation means, the lock means is in the unlocked state in a case where the first body is rotated from the first rotation range to a second rotation range with respect to the second body via the rotation means, and the lock means is in the locked state in a case where the first body is rotated from the second rotation range to a third rotation range with respect to the second body via the rotation means.

Further, the rotation means includes a rotation axis and a transmission mechanism physically connected to the rotation axis and the lock means. Rotation of the rotation axis causes movement of the transmission mechanism, which in turn causes the lock means to enter the locked or unlocked state.

Further, the lock means includes a lock body physically connected to the transmission mechanism and a locking hook connected to the lock body for locking the first body.

Further, the locking hook has a locked state and an unlocked state. The locking hook is in the locked state such that the first body is securely connected to the insertion connector and cannot be physically pulled out of and disconnected from the insertion connector in a case where the first body is rotated to the first rotation range with respect to the second body via the rotation means. The locking hook is in the unlocked state such that the first body is insecurely connected to the insertion connecter and can be physically pulled out of and disconnected from the insertion connector in a case where the first body is rotated from the first rotation range to the second rotation range with respect to the second body via the rotation means. The locking hook is in the locked state such that the first body is securely connected to the insertion connector and cannot be physically pulled out of and disconnected from the insertion connector in a case where the first body is rotated from the second rotation range to the third rotation range with respect to the second body via the rotation means.

The electronic device further includes an elastic mechanism physically connected to the locking hook and applying a force to cause the locking hook to enter the locked state when the locking hook is in the unlocked state.

In another aspect, according to another embodiment of the present invention, a dock is provided. The dock includes a lock means having a locked state and an unlocked state and physically locking a first body and a second body, and a rotation means physically connected to the lock means. The lock means is in the locked state in a case where the rotation means is rotated to a first rotation range under an external force. The lock means is in the unlocked state in a case where the rotation means is rotated from the first rotation range to a second rotation range under an external force. The lock means is in the locked state in a case where the rotation means is rotated from the second rotation range to a third rotation range under an external force.

The dock further includes an elastic mechanism physically connected to the lock means and applying a force to cause the lock means to enter the locked state when the lock means is in the unlocked state.

Further, the rotation means includes a rotation axis, and a transmission mechanism physically connected to the rotation axis and the lock means and arranged between the rotation axis and the lock means. Rotation of the rotation axis causes movement of the transmission mechanism, which in turn causes the lock means to enter the locked or unlocked state.

Further, the lock means includes a lock body physically connected to the rotation means, and a locking hook connected to the lock body for locking the first body.

Further, the lock body is physically connected to the transmission mechanism and the lock means has at least a slope. The rotation of the rotation axis causes the movement of the transmission mechanism, which applies an effect on the slope of the lock body such that the lock body and the locking hook move to cause the locking look to enter the locked or unlocked state.

One or more of the above solutions has the following technical effects or advantages.

In the solutions of the present invention, the rotation means and the lock means cooperate to allow automatic locking or unlocking when the first body is rotated with respect to the second body in the electronic device, thereby avoiding manual operations.

Further, the electronic device can be automatically locked or unlocked by cooperation between specific structures in the rotation means and the lock means. When compared with the prior art, the solutions of the present invention have simpler structural designs and are easier to implement.

Further, with the specific structures of the rotation means and the lock means in the dock, automatic locking or unlocking is possible when the first body is rotated with respect to the second body in the electronic device, thereby avoiding manual operations.

Further, the specific structure of the dock can be applied to other aspects in practice in additional to electronic devices.

DETAILED DESCRIPTION OF THE EMBODIMENTS

In order to solve the technical problem that a tablet computer cannot be automatically detached from a base, an electronic device and a dock are provided in the embodiments of the present invention. The general concept of the present invention will be described in the following.

An electronic device is designed. In the electronic device, an insertion connector is provided in order to connect a first body and a second body. The first body and the second body are physically connected/disconnected to/from each other by inserting the first body into the insertion connector or pulling the first body out of the insertion connector. In order to lock the first body and the second body, a rotation means and a lock means in the electronic device cooperate such that the first body and the second body are in a locked or unlocked state when the first body and the second body in the electronic device are moved and rotated to a particular range with respect to each other, without any manual operation.

A dock is further provided. In the dock, a lock means and a rotation means cooperate such that the rotation of the rotation means causes the lock means to enter a locked or unlocked state.

The principles, implementations and corresponding achievable advantageous effects will be detailed in the following with reference to the figures, such that the solutions of the embodiments of the present application will be understood by those skilled in the art clearly and comprehensively.

First Embodiment

Figure 1:
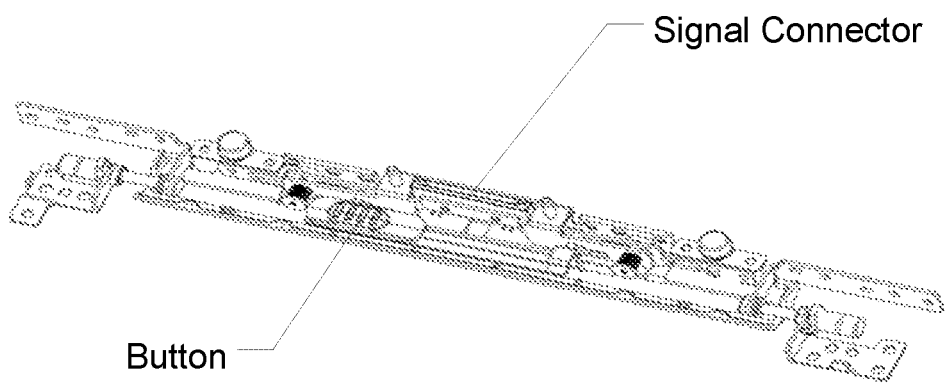
FIG. 1 is a structural diagram in the prior art.
Figure 2:
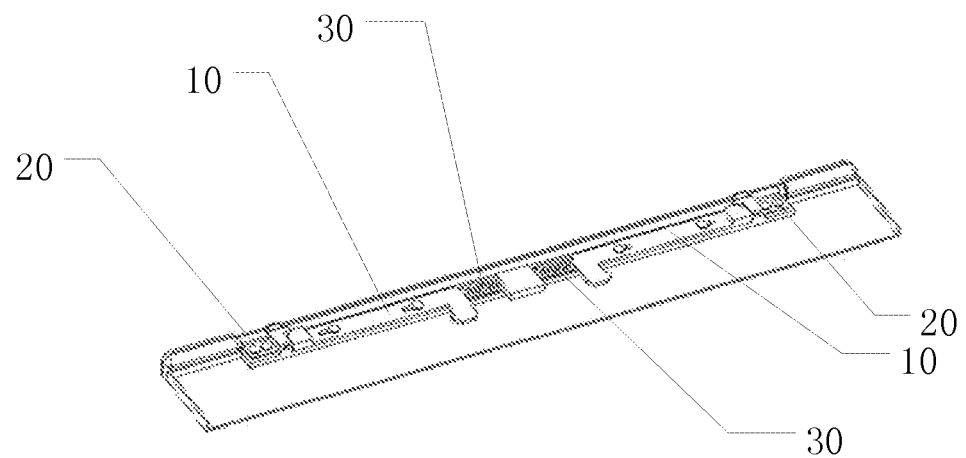
FIG. 2 is a structural diagram of a dock according to an embodiment of the present application.

FIG. 2 shows a dock according to the embodiment of the present application. It can be seen from FIG. 2 that the dock mainly includes a lock means 10 and a rotation means 20.

The lock means 10 has a locked state and an unlocked state and is used for physically locking a first body and a second body.

The rotation means 20 is physically connected to the lock means 10.

In addition to the above structure, the dock according to the embodiment of the present application further includes an elastic mechanism 30 connected to the lock means 10.

During the entire rotation process of the rotation means 20, the lock means 10 can be switched from the locked state to the unlocked state, or vice versa.

The lock means 10 is in the locked state when the rotation means 20 is rotated to a first rotation range under an external force.

The lock means 10 is in the unlocked state when the rotation means 20 is rotated from the first rotation range to a second rotation range under an external force, and The lock means 10 is in the locked state when the rotation means 20 is rotated from the second rotation range to a third rotation range under an external force.

The process in which the lock means is switched from the locked state to the unlocked state and then switched from the unlocked state to the locked state will be detailed later. Here, the rotation means 20 and the lock means 10 will be described first.

Figure 3:
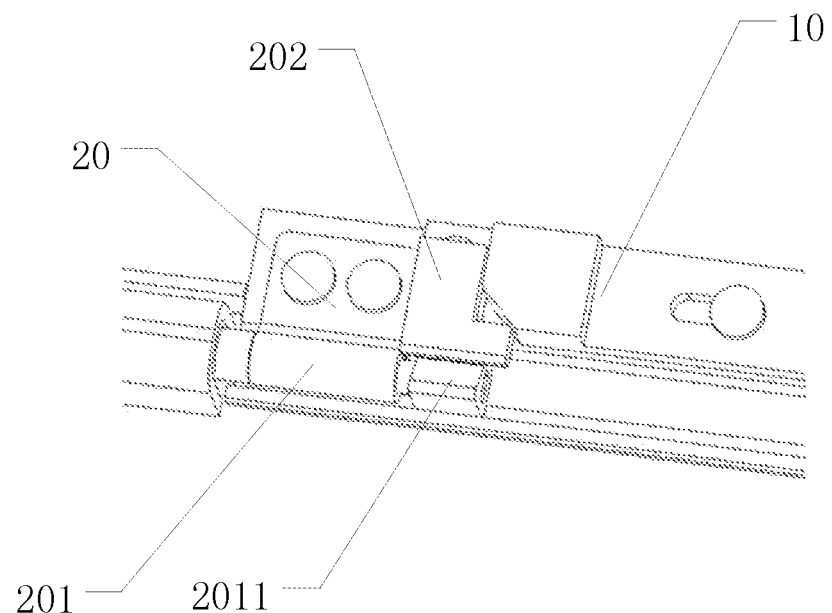
FIG. 3 is a structural diagram of a rotation means according to an embodiment of the present application.

FIG. 3 shows the structure of the rotation means 20. As shown, the rotation means 20 includes a rotation axis 201 and a transmission mechanism 202.

In the embodiment of the present application, the transmission mechanism 202 is physically connected to the rotation axis 201. As shown in FIG. 3, the rotation axis 201 has an axis head 2011 of an irregular shape. However, the axis head 2011 can be regularly shaped in practice. The transmission mechanism 202 and the axis head 2011 are physically connected.

In addition, the transmission mechanism 202 is physically connected to the lock means 10 and arranged between the rotation axis 201 and the lock means 10. As shown in FIG. 3, a part of the transmission mechanism 202 extends to the lock means 10.

Figure 4:
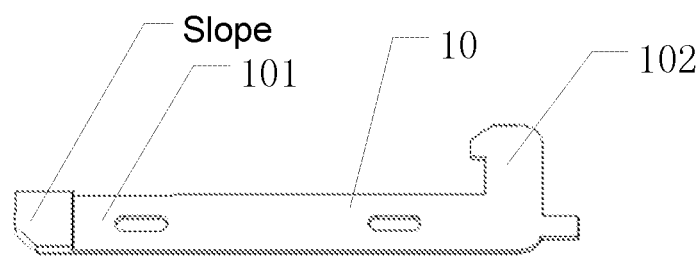
FIG. 4 is a structural diagram of a lock means according to an embodiment of the present application.

The structure of the lock means 10 is shown in FIG. 4. In FIG. 4, the lock means 10 includes a lock body 101 and a locking hook 102.

The lock body 101 is physically connected to the rotation means 20. The locking hook 102 is connected to the lock body 101 for locking the first body.

The lock body 101 is physically connected to the transmission mechanism 202. As shown in FIG. 4, the lock means has at least a slope.

Figure 5:
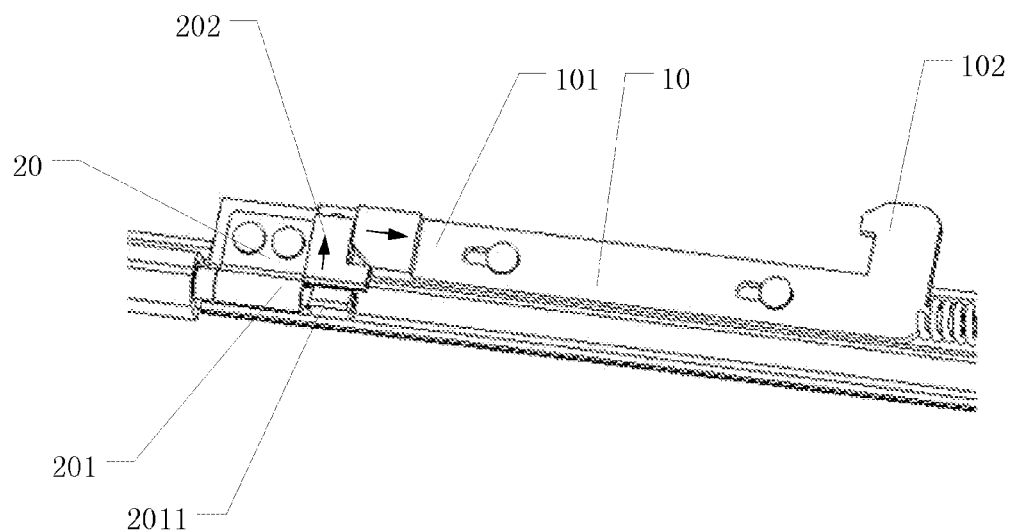
FIG. 5 is a schematic diagram showing a combination of a rotation means and a lock means according to an embodiment of the present application.

The structures of the rotation means and the lock means are shown in FIG. 5. In FIG. 5, the rotation of the rotation axis 201 causes the movement of the transmission mechanism 202, which applies an effect on the slope of the lock body 101 such that the lock body 101 and the locking hook 102 move to cause the locking look 102 to enter the locked or unlocked state.

In the embodiment of the present application, as shown in FIG. 5, the transmission mechanism 202 can be a small, irregular slider, a part of which extends to an end of the lock means 10. Since in the embodiment of the present invention the axis head 2011 of the rotation axis 201 has an irregular shape, the axis head 2011 can cooperate with the transmission mechanism 202. In this way, when the rotation axis 201 is rotated under an external force, the transmission mechanism 202 moves in the direction indicated by the arrow on the transmission mechanism 202 in FIG. 5. Since a part of the transmission mechanism 202 extends to the lock means 10, the movement of the transmission mechanism 202 generates a pushing force applied on the lock means 10, such that the lock means 10 moves in the direction indicated by the arrow on the lock means 10 in FIG. 5.

In particular, when a user uses the dock for example, he/she applies a force on the rotation means 20 to rotate the rotation means 20. When the rotation means 20 and the lock means 10 are about to start rotating, the lock means 10 is in the locked state. When the rotation means 20 starts to rotate under an external force, the cooperation between the axis head 2011 and the transmission mechanism 202 causes the transmission mechanism 202 to move in the direction indicated by the arrow on the transmission mechanism 202 in FIG. 5. Then, the cooperation between the transmission mechanism 202 and the lock means 10 causes the lock means 10 to move in the direction indicated by the arrow on the lock means 10 in FIG. 5 (i.e., move to the left as seen in FIG. 5). At this time, since an elastic mechanism 30 is provided, it will be compressed to create a reactive force. When the lock means 10 moves, it will remain in the locked state until it reaches the rotation range required for unlocking. When the lock means 10 moves to a particular range, e.g., a second rotation range, it will be switched to the unlocked state. The process of unlocking the lock means 10 will be detailed in relation to the electronic device in the second embodiment.

When the rotation means 20 is about to start rotating from the second rotation range, due to the shape of the axis head 2011 of the rotation axis 201, it can be seen that the lock means 10 has moved over the maximum displacement to the left when the axis head 2011 has rotated to an edge of the axis head 2011. Further rotation will cause the axis head 2011 of the rotation axis 201 to jump to another face and restart rotating (i.e., equivalent to the case where the rotation means 20 is about to start rotating). At this time, the force applied by the rotation axis 201 on the transmission mechanism 202 will disappear instantaneously, which in turn causes the force applied by the transmission mechanism 202 on the lock means 10 to disappear instantaneously. In this case, due to the reactive force from the elastic mechanism 30, the lock means 10 will be pushed to move in the direction opposite to the direction indicated by the arrow on the lock means 10 in FIG. 5. When the transmission mechanism 202 is physically re-connected to the axis head 2011, the reactive force from the elastic mechanism 30 will be equalized by the force from the axis head 2011 to reach a balance state. At this time, the lock means will return to its initial locked state due to the reactive force from the elastic mechanism 30.

The structure of the dock has been described with reference to the above embodiment. When compared with the conventional structure for locking a tablet computer, the structure according to the embodiment has a simpler design by which the lock means 10 can be caused to enter the locked or unlocked state by simply rotating the rotation means 20. In this way, a tablet computer can be locked or unlocked without manual operation.

The movement of the dock will be detailed in the following embodiments in relation to the first body and the second body.

Second Embodiment

Figure 6:
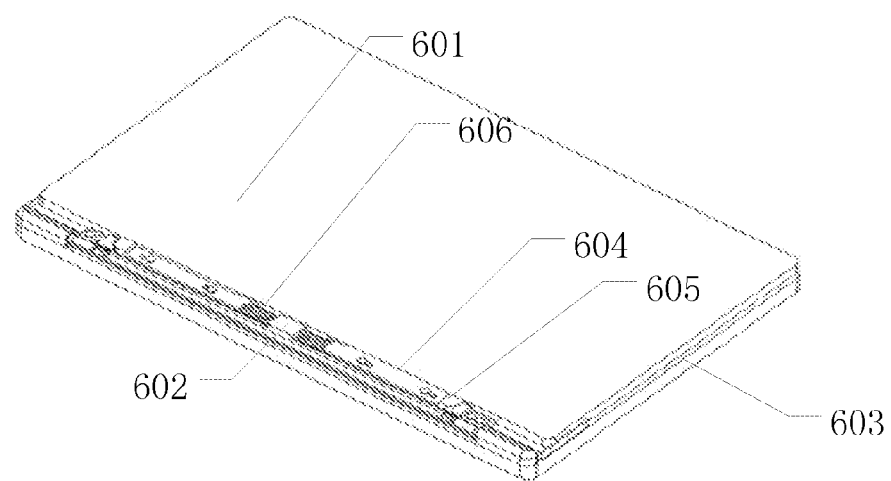
FIG. 6 is a structural diagram of an electronic device according to an embodiment of the present application.

In the embodiment of the present application, an electronic device is provided, as shown in FIG. 6. The electronic device includes a first body 601, an insertion connector 602 connected to the first body 601, a second body 603, a lock means 604 and a rotation means 605.

The second body 603 is also connected to the insertion connector 602 and physically connected/disconnected to/from the first body 601 via the insertion connector 602 by inserting the first body into the insertion connector or pulling the first body out of the insertion connector.

According to the embodiments of the present application, various designs can be applied to the insertion connector 602. For example, the insertion connector 602 can be designed as a groove, as the insertion connector 602 shown in FIG. 6, arranged between elastic mechanisms 606. By designing the first body 601 to have a corresponding insertion angle, the first body 601 can be inserted into the insertion connector 602 or pulled out of the insertion connector 602.

The lock means 604 has a locked state and an unlocked state.

The first body 601 is securely connected to the insertion connector 602 and cannot be physically pulled out of and disconnected from the insertion connector 602 when the lock means 604 is in the locked state.

The first body 601 is insecurely connected to the insertion connecter 602 and can be physically pulled out of and disconnected from the insertion connector 602 when the lock means 604 is in the unlocked state.

The rotation means 605 is physically connected to the lock means 604.

In the embodiment of the present application, the first body 601 can be operated by operating the second body 603 when they are physically connected. That is, in addition to the physical connection between the first body 601 and the second body 603, the first body 601 and the second body 603 are connected via a signal connector or a wireless network signal. When they are connected via a signal connector, the insertion connector 602 in this embodiment can be used as the signal connector or a separate signal connector can be used.

When the first body 601 is connected to the second body 603 via the insertion connector 602, the lock means 604 is in the locked state in a case where the first body 601 is rotated to a first rotation range with respect to the second body 603 via the rotation means 605, the lock means 604 is in the unlocked state in a case where the first body 601 is rotated from the first rotation range to a second rotation range with respect to the second body 603 via the rotation means 605, and the lock means 604 is in the locked state in a case where the first body 601 is rotated from the second rotation range to a third rotation range with respect to the second body 603 via the rotation means 605.

The structure of the rotation means 605 has been detailed above in relation to FIG. 3. The rotation means 605 includes a rotation axis and a transmission mechanism. The connection and relative movement between the rotation axis and the transmission mechanism have been described above and will be omitted here.

The structure of the lock means 604 has been detailed above in relation to FIG. 4. The lock means 604 includes a lock body and a locking hook. The connection and relative movement between the lock body and the locking hook have been described above and will be omitted here.

In addition to the above structures, the electronic device further includes an elastic mechanism 606 physically connected to the locking hook and applying a force to cause the locking hook to enter the locked state when the locking hook is in the unlocked state.

The structure of the elastic mechanism 606 has been described above in relation to FIG. 2 and will be omitted here.

Further, the physical connection or disconnection between the first body 601 and the second body 603 are facilitated by using two components. The first component is the insertion connector 602 which allows the first body 601 and the second body 603 to be physically connected to or disconnected from each other. The insertion connector 602 also serves as a signal connector to allow the first body 601 and the second body 603 to be connected into a complete unit. For example, the first body 601 can be a tablet computer and the second body 603 can be an input device such as a keyboard. In this case, after the first body 601 and the second body 603 are connected via the insertion connector 602, the user can not only operate the first body 601, but also operate the first body 601 via the second body 603.

In addition to the insertion connector 602, the first body 601 and the second 603 can be physically connected by the locking hook of the lock means 604. The locking hook has a locked state and an unlocked state and is used to lock and unlock the first body 601 and the second body 603.

The movement process for locking and unlocking the first body 601 and the second body 603 by using the locking hook is as follows.

When the first body 601 is rotated to a first rotation range with respect to the second body 603 via the rotation means 605, the locking hook is in the locked state and the first body 601 is securely connected to the insertion connector 602 and cannot be physically pulled out of and disconnected from the insertion connector 602.

When the first body 601 is rotated from the first rotation range to a second rotation range with respect to the second body 603 via the rotation means 605, the locking hook is in the unlocked state and the first body 601 is insecurely connected to the insertion connector 602 and can be physically pulled out of and disconnected from the insertion connector 602.

When the first body 601 is rotated from the second rotation range to a third rotation range with respect to the second body 603 via the rotation means 605, the locking hook is in the locked state and the first body 601 is securely connected to the insertion connector 602 and cannot be physically pulled out of and disconnected from the insertion connector 602.

The following example is given to explain the above process in further detail.

In an embodiment of the present application, the first rotation range is set as 45°, the second rotation range is set as 75° and the third rotation range is set as above 75°.

When the first body 601 is about to start rotating with respect to the second body 603, the first body 601 is connected to the second body 603 via the insertion connector 602 and the locking hook.

When the first body 601 rotates from 0° to 45° with respect to the second body 603, the first body 601 rotates to the first rotation range with respect to the second to body 603. At this time, the axis head of the rotation axis and the transmission mechanism in the rotation means 605 cooperate to cause the transmission mechanism to move in the direction indicated by the arrow on the transmission mechanism in FIG. 5. This causes the lock body of the lock means 604 to move and thus the locking hook starts to move in the direction indicated by the arrow on the lock means in FIG. 5. However, within the range from 0° to 45°, the locking hook has not moved to the position of the corresponding lock hole in the first body 601. Accordingly, in this rotation range, the first body 601 is connected to the second body 603 via the insertion connector 602 and the locking hook.

When the first body 601 rotates to 45° with respect to the second body 603 and further rotates within the range from 45° to 75°, it moves from the first rotation range to the second rotation range. At this time, the movement of the axis head in the rotation means 605 causes the lock means 604 to move and the locking hook will move to the position of the corresponding lock hole in the first body 601. In this case, the first body 601 is in the unlocked state and is only connected to the second body 603 via the insertion connector 602. When the user detaches the first body 601 from the insertion connector 602, the first body 601 is separated from the second body 603.

In this range, the axis head moves to the position of the edge, as shown in FIG. 5. Thus, the unlocking function can be achieved. At this time, due to the effect of the elastic mechanism 606, after the first body 601 is separated from the second body 603, the elastic mechanism 606 will apply a reactive force on the lock means 604 to cause the lock means 604 to return to its initial state.

When the first body 601 rotates to 75° with respect to the second body 603 and further rotates from 75°, the axis head of the rotation axis in the rotation means 605 will jump to another face and restart rotating (i.e., equivalent to the case where the rotation means 605 is about to start rotating). At this time, the force applied by the rotation axis on the transmission mechanism will disappear instantaneously, which in turn causes the force applied by the transmission mechanism on the lock means to disappear instantaneously. In this case, due to the reactive force from the elastic mechanism 606, the lock means 604 will be pushed to move in the direction opposite to the direction indicated by the arrow on the lock means 604 in FIG. 5. When the transmission mechanism is physically re-connected to the axis head, the reactive force from the elastic mechanism will be equalized by the force from the axis head to reach a balance state. At this time, the lock means will return to its initial locked state due to the reactive force from the elastic mechanism.

In this rotation range, the first body 601 is connected to the second body 603 via the insertion connector 602 and the locking hook.

The structure and operation principle of the electronic device as well as the relative movements between the first body and the second body have been described in the above embodiment. The operation principle is the same as that described in the first embodiment with reference to FIG. 5, except that the first body 601, the insertion connector 602 and the second body 603 are introduced. With the corresponding lock hole in the first body 601, the lock means 604 is unlocked to unlock the first body such that the first body is only connected to the second body 603 via the insertion connector 602.

In both embodiments of the present invention, the axis head of the rotation means is irregularly shaped. However, the present application is not limited to the irregular shape in the embodiments. In practice, an axis head of any other shape can also be used as long as the same function is achieved. Similarly, the present application is not limited to the above specific arrangements of the transmission mechanism and the lock means.

The following technical effects can be achieved according to one or more embodiments of the present invention.

In the embodiments of the present invention, the rotation means and the lock means cooperate to allow automatic locking or unlocking when the first body rotates with respect to the second body in the electronic device, thereby avoiding manual operations.

Further, the electronic device can be automatically locked or unlocked by cooperation between specific structures in the rotation means and the lock means.

When compared with the prior art, the embodiments of the present invention have simpler structural designs and are easier to implement.

Further, with the specific structures of the rotation means and the lock means in the dock, automatic locking or unlocking is possible when the first body rotates with respect to the second body in the electronic device, thereby avoiding manual operations.

Further, the specific structure of the dock can be applied to other aspects in practice in additional to electronic devices.

The present invention has been described with reference to the above embodiments. However, the scope of the present invention is not limited to the above embodiments. Modifications and alternatives can be made by those skilled in the art without departing from the scope of the present invention. These modifications and alternatives are to be encompassed by the scope of the present invention which is defined by the claims as attached.

What is claimed is:

1. An electronic device, comprising:
    a first body;
    an insertion connector for connecting the first body;
    a second body connected to the insertion connector and physically connected/disconnected to/from the first body via the insertion connector by inserting the first body into the insertion connector or pulling the first body out of the insertion connector;
    a lock means having a locked state and an unlocked state, wherein the first body is securely connected to the insertion connector and cannot be physically pulled out of and disconnected from the insertion connector when the lock means is in the locked state, and wherein the first body is insecurely connected to the insertion connecter and can be physically pulled out of and disconnected from the insertion connector when the lock means is in the unlocked state; and
    a rotation means physically connected to the lock means, wherein when the first body is connected to the second body via the insertion connector,
        the lock means is in the locked state in a case where the first body is rotated to a first rotation range with respect to the second body via the rotation means,
        the lock means is in the unlocked state in a case where the first body is rotated from the first rotation range to a second rotation range with respect to the second body via the rotation means, and
        the lock means is in the locked state in a case where the first body is rotated from the second rotation range to a third rotation range with respect to the second body via the rotation means.

2. The electronic device of claim 1, wherein the rotation means comprises:
    a rotation axis; and
    a transmission mechanism physically connected to the rotation axis and the lock means,
    wherein rotation of the rotation axis causes movement of the transmission mechanism, which in turn causes the lock means to enter the locked or unlocked state.

3. The electronic device of claim 1, wherein the lock means comprises:
    a lock body physically connected to the transmission mechanism; and
    a locking hook connected to the lock body for locking the first body.

4. The electronic device of claim 3, wherein
    the locking hook has a locked state and an unlocked state, and
    the locking hook is in the locked state such that the first body is securely connected to the insertion connector and cannot be physically pulled out of and disconnected from the insertion connector in a case where the first body is rotated to the first rotation range with respect to the second body via the rotation means,
    the locking hook is in the unlocked state such that the first body is insecurely connected to the insertion connecter and can be physically pulled out of and disconnected from the insertion connector in a case where the first body is rotated from the first rotation range to the second rotation range with respect to the second body via the rotation means, and
    the locking hook is in the locked state such that the first body is securely connected to the insertion connector and cannot be physically pulled out of and disconnected from the insertion connector in a case where the first body is rotated from the second rotation range to the third rotation range with respect to the second body via the rotation means.

5. The electronic device of claim 4, further comprising:
    an elastic mechanism physically connected to the locking hook and applying a force to cause the locking hook to enter the locked state when the locking hook is in the unlocked state.

6. A dock, comprising:
    a lock means having a locked state and an unlocked state and physically locking a first body and a second body; and
    a rotation means physically connected to the lock means, wherein
    the lock means is in the locked state in a case where the rotation means is rotated to a first rotation range under an external force,
    the lock means is in the unlocked state in a case where the rotation means is rotated from the first rotation range to a second rotation range under an external force, and
    the lock means is in the locked state in a case where the rotation means is rotated from the second rotation range to a third rotation range under an external force.

7. The dock of claim 6, further comprising:
    an elastic mechanism physically connected to the lock means and applying a force to cause the lock means to enter the locked state when the lock means is in the unlocked state.

8. The dock of claim 6, wherein the rotation means comprises:
    a rotation axis; and
    a transmission mechanism physically connected to the rotation axis and the lock means and arranged between the rotation axis and the lock means,
    wherein rotation of the rotation axis causes movement of the transmission mechanism, which in turn causes the lock means to enter the locked or unlocked state.

9. The dock of claim 6, wherein the lock means comprises:
    a lock body physically connected to the rotation means; and
    a locking hook connected to the lock body for locking the first body.

10. The dock of claim 8, wherein
    the lock body is physically connected to the transmission mechanism and the lock means has at least a slope, and
    the rotation of the rotation axis causes the movement of the transmission mechanism, which applies an effect on the slope of the lock body such that the lock body and the locking hook move to cause the locking look to enter the locked or unlocked state.

11. The dock of claim 9, wherein
the lock body is physically connected to the transmission mechanism and the lock means has at least a slope, and
the rotation of the rotation axis causes the movement of the transmission mechanism, which applies an effect on the slope of the lock body such that the lock body and the locking hook move to cause the locking look to enter the locked or unlocked state.

* * * * *